(12) United States Patent
Kawamoto

(10) Patent No.: US 7,615,431 B2
(45) Date of Patent: Nov. 10, 2009

(54) MANUFACTURING METHOD OF SEMICONDUCTOR DEVICE

(75) Inventor: Tomokazu Kawamoto, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 391 days.

(21) Appl. No.: 11/214,888

(22) Filed: Aug. 31, 2005

(65) Prior Publication Data
US 2006/0166410 A1    Jul. 27, 2006

(30) Foreign Application Priority Data
Jan. 25, 2005    (JP) .............. 2005-016938

(51) Int. Cl.
*H01L 21/8238* (2006.01)
(52) U.S. Cl. .............. 438/199; 257/E21.492; 257/E21.632; 438/780
(58) Field of Classification Search .......... 257/E21.492, 257/E21.632; 438/199, 780
See application file for complete search history.

(56) References Cited

U.S. PATENT DOCUMENTS

| 5,720,814 | A * | 2/1998 | Takagi et al. ............... 118/319 |
| 6,183,810 | B1 | 2/2001 | Ota |
| 6,485,782 | B2 * | 11/2002 | Takamori ................... 427/240 |
| 6,689,215 | B2 * | 2/2004 | Nguyen ..................... 118/313 |
| 2003/0108349 | A1 * | 6/2003 | Kanagawa .................. 396/611 |
| 2004/0217394 | A1 * | 11/2004 | Lee ........................... 257/291 |
| 2007/0120159 | A1 | 5/2007 | Lee |

FOREIGN PATENT DOCUMENTS

| JP | 1991-076109 A | 4/1991 |
| JP | 1993-243140 A | 9/1993 |
| JP | 1999-267573 A | 10/1999 |
| JP | 2004-336003 A | 11/2004 |

OTHER PUBLICATIONS

Patent Abstracts of Japan, Publication No. 2004336003 A, published on Nov. 25, 2004.
Patent Abstracts of Japan, Publication No. 2003209121 A, published on Jul. 25, 2003.
Patent Abstracts of Japan, Publication No. 2001307984 A, published on Nov. 2, 2001.
"Japanese Office Action", English summary, Mailed Jan. 20, 2009, in regards to JP App. 2005-016938.

* cited by examiner

*Primary Examiner*—Asok K Sarkar
(74) *Attorney, Agent, or Firm*—Fujitsu Patent Center

(57) ABSTRACT

Before applying a resist on a first gate insulating film, a thinner is provided on an entire surface including a surface of the first gate insulating film to wash the surface of the first gate insulating film. Specifically, while a semiconductor substrate is being rotated, onto a central part thereof the thinner is provided from a nozzle, so that the thinner is spread outward in a radial direction of the semiconductor substrate to be applied on an entire surface of the semiconductor substrate by a centrifugal force.

10 Claims, 8 Drawing Sheets

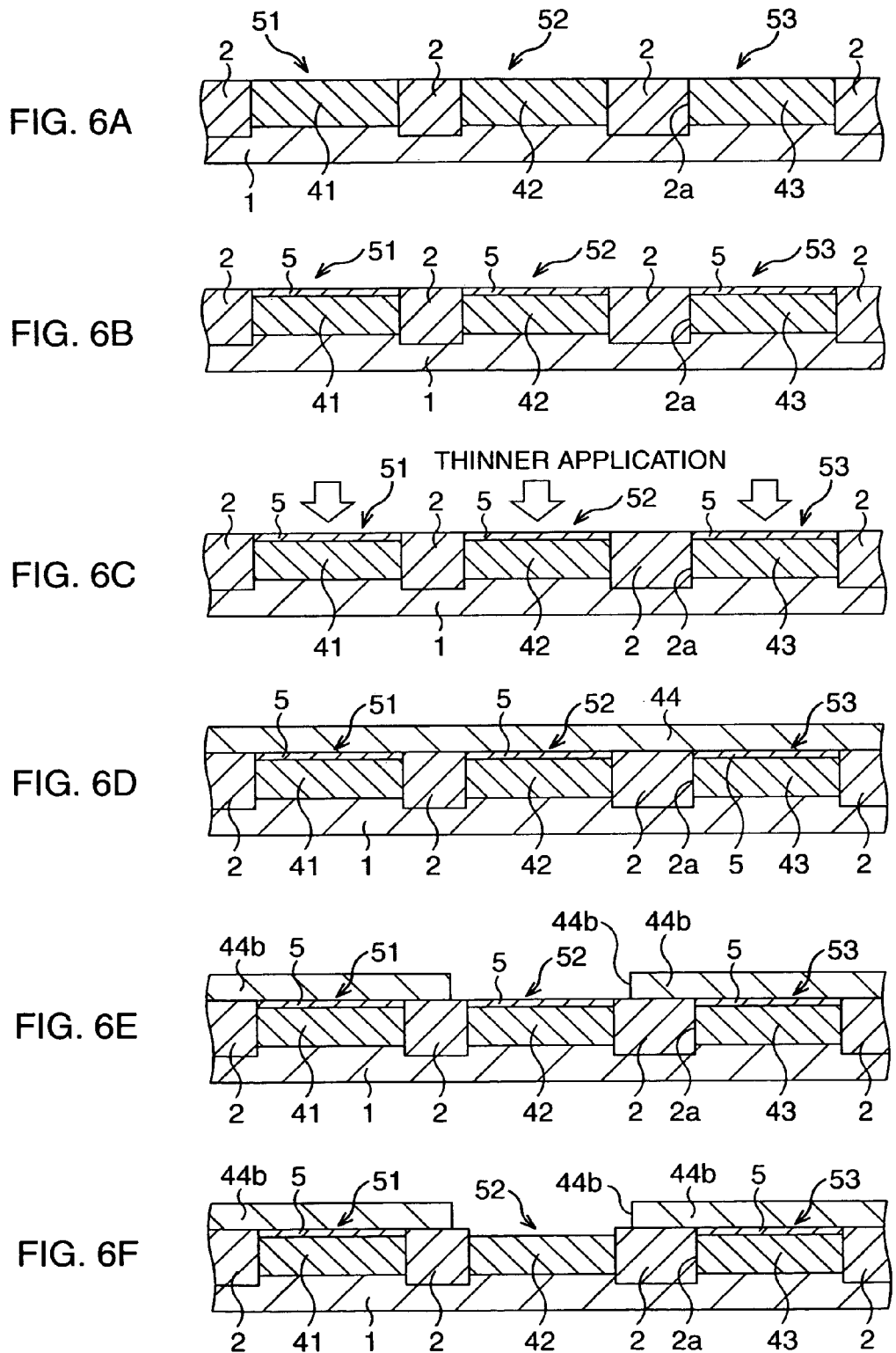

MANUFACTURING METHOD OF SEMICONDUCTOR DEVICE

CROSS-REFERENCE TO RELATED APPLICATIONS

This application is based upon and claims the benefit of priority from the prior Japanese Patent Application No. 2005-016938, filed on Jan. 25, 2005, the entire contents of which are incorporated herein by reference.

BACKGROUND OF THE INVENTION

1. Field of the Invention

The present invention relates to a manufacturing method of a semiconductor device having a gate electrode such as mainly a MOS transistor.

2. Description of the Related Art

In order to fabricate multiple types of MOS transistors having different driving voltages on the same substrate, gate insulating films of the respective MOS transistors should be formed to have predetermined different film thicknesses. Here, there is exemplified a case in which two types of MOS transistors, that is, MOS transistors for two power supplies, are fabricated.

First, after a first gate insulating film is formed above a semiconductor substrate (or semiconductor layer), a resist pattern is formed on this first gate insulating film, and with this resist pattern being a mask, the first gate insulating film is processed by etching so that a predetermined portion of the first gate insulating film is removed. Here, as the etching of the first gate insulating film, common dry etching is not adequate but wet etching using, for example, an HF solution as an etching solution is suitable, since the gate insulating film is quite thin and vulnerable to damage. Then, by forming a second gate insulating film on the entire surface, there are formed a first region of only the second gate insulating film and a second region in which the first and second gate insulating films are stacked. There are formed a first gate electrode for low voltage drive in the first region, and a second gate electrode for high voltage drive in the second region.

Incidentally, in a case of three or more power supplies, there should be repeated steps of further stacking a gate insulating film, etching it to the first gate insulating film, and stacking and forming a gate insulating film again.

(Patent Document 1) Japanese Patent Application Laid-open No. 2004-336003

(Patent Document 2) Japanese Patent Application Laid-open No. 2003-209121

(Patent Document 3) Japanese Patent Application Laid-Open No. 2001-307984

However, as the gate insulating film gets further thinner, deterioration of film quality which is considered to be due to damage by the step after formation of the gate insulating film is beginning to be regarded as a problem.

SUMMARY OF THE INVENTION

The present invention is made in view of the above-described problem and its object is to provide a manufacturing method of a highly reliable semiconductor device capable of sufficiently coping with the further thinner gate insulating film by restraining damage which the thin gate insulating film receives and realizing superior film quality and yield of the gate insulating film.

A manufacturing method of a semiconductor device of the present invention is a manufacturing method of a semiconductor device having at least two types of transistors in which film thicknesses of gate insulating films are different, and includes the steps of: forming a first gate insulating film above a semiconductor substrate; applying a thinner on a surface of the first gate insulating film; forming a resist pattern above the first gate insulating film on which the thinner has been applied; etching the first gate insulating film with the resist pattern being a mask, to remove a part of the first gate insulating film; and forming a second gate insulating film to form a region in which only the second gate insulating film is formed and a region in which at least the first and second gate insulating films are stacked.

BRIEF DESCRIPTION OF THE DRAWINGS

FIGS. 6A to 6F are schematic cross-sectional views showing a manufacturing method of MOS transistors according to a second embodiment step by step;

DETAILED DESCRIPTION OF THE PREFERRED EMBODIMENTS

Basic Gist of the Present Invention

A most influential step causing damage to a gate insulating film is considered to be mainly soon after formation thereof, and as one of these a step of wet etching the gate insulating film is cited.

Figure 1:
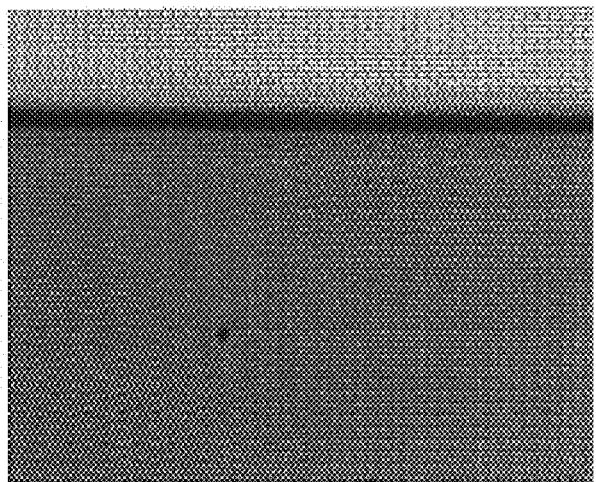
FIG. 1 is a photograph using a microscope showing a state that a pinhole is formed in a resist.

In forming first and second gate insulating films, when a resist is applied on the first gate insulating film, a pinhole may occur in the resist. A state that the pinhole is actually formed in the resist is shown in a microphotograph of FIG. 1. At this time, there is a problem that at a time of wet etching using a resist pattern, an etching solution permeates from the pinhole and the first gate insulating film is etched, causing film quality to deteriorate. If the first gate insulating film is relatively thick, the above-described deterioration of film quality by wet etching is not a problem so much, but in recent years the gate insulating film is getting notably thinner to cope with a request for further miniaturization of a MOS transistor, and deterioration of film quality of the first gate insulating film becomes a serious problem.

In the present invention, before the resist is applied on the first gate insulating film, a thinner is applied on a surface of the first gate insulating film for surface washing and then the resist is applied to form a resist pattern. The present inventors has found that by washing of the first gate insulating film surface using the thinner before the application of the resist, an interface state of the first gate insulating film and the resist becomes good, so that wettability of the first gate insulating film against the resist is improved and adhesiveness to the resist is enhanced. In this case, in a step of wet etching the first gate insulating film with a resist pattern being a mask, even if a pinhole exists in the resist pattern and an etching solution permeates through the pinhole, it is considered that the etching solution hardly reaches the first gate insulating film since high adhesiveness is secured between the first gate insulating film and the resist. Therefore, there is hardly any damage to the first gate insulating film, and the first gate insulating film is maintained in a good state of film quality as at a time of formation.

In this regard, a thinner is conventionally used rather for removing a resist. For example, in Patent Document 1, there is disclosed an art in which in forming first and second gate insulating films, after the first gate insulating film is processed using a resist pattern, the resist pattern is removed using a thinner. Also in Patent Document 2, there is disclosed an art in which a part of a resist pattern for forming a gate electrode is removed using a thinner.

In the present invention, it is aimed that by using the thinner for surface washing of the first gate insulating film rather than for resist removal, adhesiveness to the resist is enhanced and wet etching is securely performed without causing a negative effect on the first gate insulating film.

Incidentally, when forming gate insulating films with three or more types of film thicknesses, in order to form gate insulating films with three types of film thicknesses for example, first, subsequently to an etching process of the first gate insulating film including surface washing of the first gate insulating film using a thinner, a second gate insulating film is formed, and a predetermined portion of the stacked first and second gate insulating films is processed and removed again by lithography. At this time, under a resist pattern, there exists a region in which only the second gate insulating film is formed above a semiconductor substrate (semiconductor layer), and since the same problem as described above may occur, a thinner is applied on a surface of the second gate insulating film for surface washing before a resist is applied on the second gate insulating film, and then the resist is applied to form a resist pattern. Thereafter, by forming a third gate insulating film on the entire surface, there are formed the gate insulating films with three types of film thicknesses (only the third gate insulating film, stacked film of the second and third gate insulating films, and stacked film of the first to third gate insulating films).

The present invention adopts a structure in which a focus is on two layers out of multiple layers (at least two layers) of gate insulating films. Therefore, when forming gate insulating films with three or more types of film thicknesses, the gate insulating film (the second gate insulating film in the above example) at least a part of which is in a single layer state above the semiconductor substrate (semiconductor layer) should be read as "the first gate insulating film", and the like, at a time of thinner application.

Specific Embodiments to which the Present Invention is Applied

Hereinafter, embodiments in which the present invention is applied to MOS transistors will be described in detail with reference to the drawings.

First Embodiment

In this embodiment, there is disclosed a manufacturing method of MOS transistors for two power supplies, the MOS transistors having two types of gate insulating films of different film thicknesses.

FIG. 2 and FIG. 3 are schematic cross-sectional views showing a manufacturing method of MOS transistors according to a first embodiment step by step.

Figure 2A:
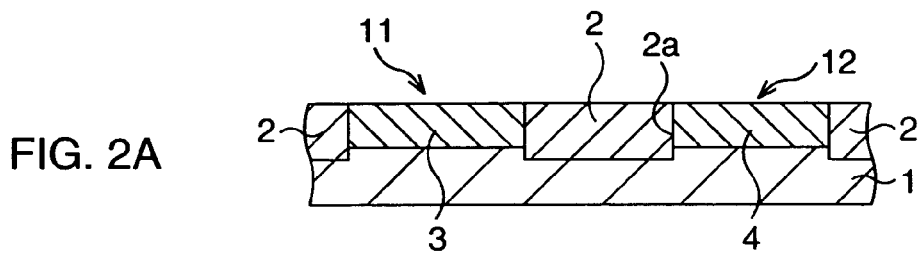
FIGS. 2A to 2F are schematic cross-sectional views showing a manufacturing method of MOS transistors according to a first embodiment step by step.

First, as shown in FIG. 2A, an element isolation structure 2 and wells 3, 4 are formed on a semiconductor substrate 1.

Here, the element isolation structure 2 is formed by an STI (Shallow Trench Isolation) method to define active regions. Specifically, a trench 2a is formed in the element isolation structure in a surface layer of the semiconductor substrate 1 of silicon, so that an insulating film, for example a silicon oxide film, is deposited in a film thickness embedding the trench 2a by a CVD method and the like. Then, the silicon oxide film is polished by a Chemical Mechanical Polishing (CMP) method for example, until a surface of the semiconductor substrate 1 is exposed, so that the element isolation structure 2 made by filling the trench 2a with the silicon oxide film is formed. Active regions 11, 12 are defined by the element isolation structure 2. Here, the active region 11 is a forming region for a MOS transistor of low voltage drive, and the active region 12 is a forming region for a MOS transistor of higher voltage drive than the MOS transistor of low voltage drive.

Next, impurities, here boron (B), are introduced into the active regions 11, 12 to form the wells 3, 4 in surface layers of the active regions 11, 12. Here, the introduction of the impurities is by ion implantation on conditions of a dose amount of about $5.0 \times 10^{13}/cm^2$ and acceleration energy of about 300 keV.

Figure 2B:
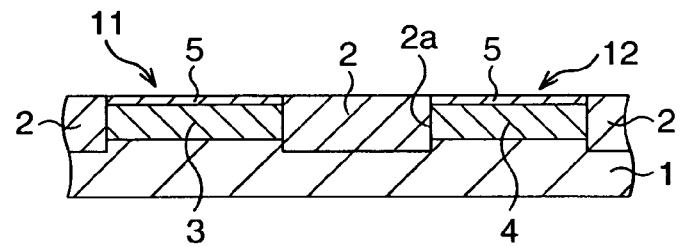

Subsequently, as shown in FIG. 2B, a first gate insulating film 5 is formed.

Specifically, an insulating film, here the first gate insulating film 5 made of a silicon oxide film, is formed above the active regions 11, 12. As for a film formation condition of the silicon oxide film, the surface layers of the active regions 11, 12 are thermally oxidized in a wet atmosphere of 750° C. for example, to be formed into a film thickness of about 5 nm.

Figure 2C:
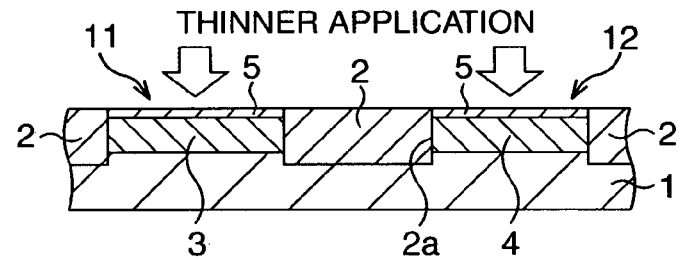

Subsequently, as shown in FIG. 2C, a thinner is applied on the entire surface including a surface of the first gate insulating film 5.

Figure 4A:
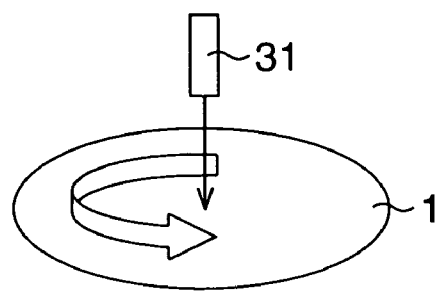
FIGS. 4A to 4D are schematic views showing concrete structures for applying a thinner on a surface of a gate insulating film.

Specifically, the thinner is provided on the entire surface including the surface of the first gate insulating film 5 to wash the surface of the first gate insulating film 5. Here, as shown in FIG. 4A, while the semiconductor substrate 1 is being rotated, to a central portion thereof the thinner is supplied from a nozzle 31, and the thinner is spread outward in a radial direction of the semiconductor substrate 1 by a centrifugal force so that the thinner is applied on the entire surface of the semiconductor substrate 1. This technique is referred to as a pre-wet treatment in Patent Document 3 for example, and the following is described in Patent Document 3: by this technique a resist can be diffused more easily, and as a consequence a uniform resist film can be formed with less resist solution so that consumption of the resist is reduced. In the present invention, the thinner application is performed only as a pretreatment for the application of the resist used for patterning a thin gate insulating film and an object thereof is to improve wettability of the gate insulating film and the resist. Therefore, an occasion to use the thinner is limited to a preceding step of the resist application on the gate insulating film surface, and in Patent Document 3 in which an object and structure are different from those of the present invention, there is no description suggesting such an occasion to use the thinner.

The thinner used here is a solvent of butyl acetate (50%)+ methoxy propanol (50%) for example. As for an application condition of the thinner, while the semiconductor substrate 1 is being rotated at 500 rpm for example, the thinner is applied for about 2 seconds in an application amount of about $1.3 \times 10^{-4}$ cc/cm$^2$ per unit area for example.

Here, there are described other preferred examples of the thinner application method in the present embodiment.

Figure 4B:
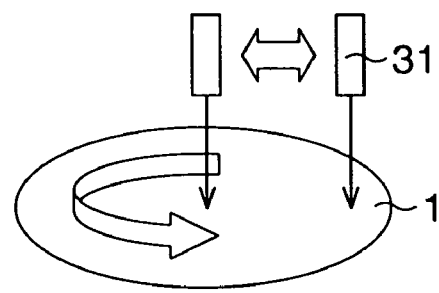

As a first example, as shown in FIG. 4B, while the semiconductor substrate 1 is being rotated, the thinner is supplied with the nozzle 31 being moved in the radial direction between the central portion and a peripheral edge thereof, so that the thinner is applied on the entire surface of the semiconductor substrate 1. By this method, even the thinner of the same amount can be applied more uniformly on the surface of the first gate insulating film 5.

Figure 4C:
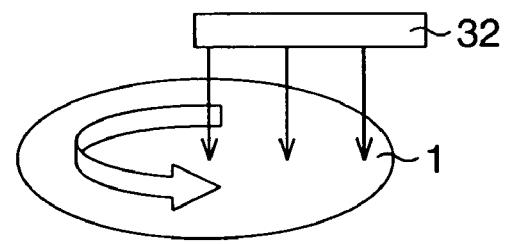

As a second example, as shown in FIG. 4C, using a nozzle 32 in which a plurality of thinner supply holes are disposed in a row, with the nozzle 32 being disposed to coincide with the radial direction of the rotation of the semiconductor substrate 1, the thinner is supplied while the semiconductor substrate 1 is being rotated, so that the thinner is applied on the entire surface of the semiconductor substrate 1. By this method, without providing a nozzle displacement mechanism, the thinner can be applied further uniformly on the surface of the first gate insulating film 5 with a relatively simple nozzle structure.

Figure 4D:
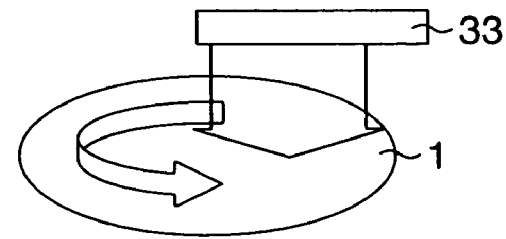

As a third example, as shown in FIG. 4D, using a nozzle 33 in which a thinner supply hole is provided linearly, with the nozzle 33 being disposed to coincide with the radial direction of the rotation of the semiconductor substrate 1, the thinner is supplied while the semiconductor substrate 1 is being rotated, so that the thinner is applied on the entire surface of the semiconductor substrate 1. By this method, without providing a nozzle displacement mechanism, the thinner can be applied further uniformly on the surface of the first gate insulating film 5 with a relatively simple nozzle structure.

Figure 5:
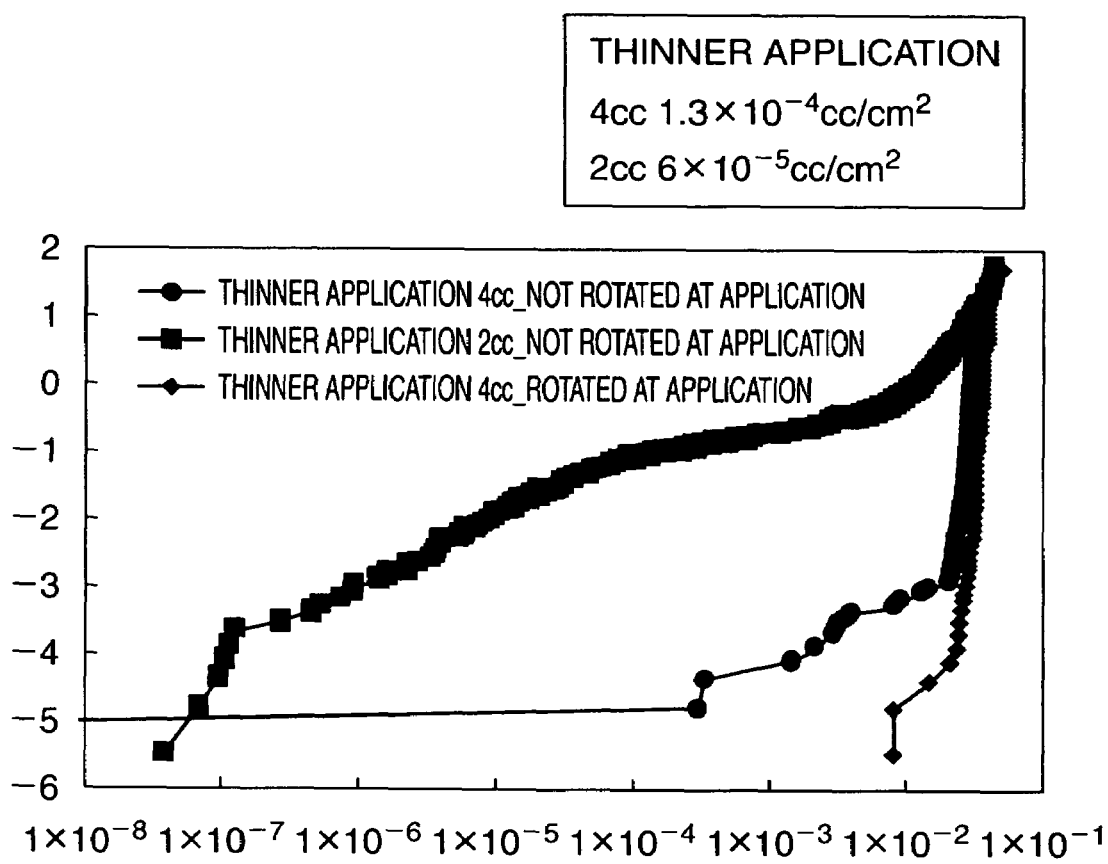
FIG. 5 is a characteristic chart of Weibull plot showing results of examinations for TDDB reliability of gate insulating films by varying thinner application conditions.

Here, reliability of the first gate insulating film is examined with the thinner application conditions being varied. Experiment results are shown in FIG. 5. This experiment is to examine the so-called TDDB reliability, and in FIG. 5, a horizontal axis indicates total amount of electric charges having flowed until the first gate insulating film is destroyed, and a vertical axis indicates Weibull values. First, it is judged that the reliability is better in the case of applying the thinner while rotating the semiconductor substrate than in the case of applying the thinner without rotating the semiconductor substrate. Further, it is considered that an optimal dose range of the thinner application amount is 2 cc in total, that is, $6 \times 10^{-5}$ cc/cm$^2$ per unit area (1 cm$^2$) is the lower limit value to exhibit high reliability as the gate insulating film. At a value at and above this lower limit value, for example at 2 cc in total, that is, $1.3 \times 10^{-4}$ cc/cm$^2$ per unit area, superior reliability is exhibited as shown in the chart, and it is judged a film quality of the first gate insulating film on which the thinner is applied under that condition is quite good. In this way, even if the first gate insulating film is quite thin, accidental failures are reduced drastically by washing the surface of the first gate insulating film with the thinner of the application amount within the range stated above, so that the reliability as the gate insulating film is enhanced.

Figure 2D:
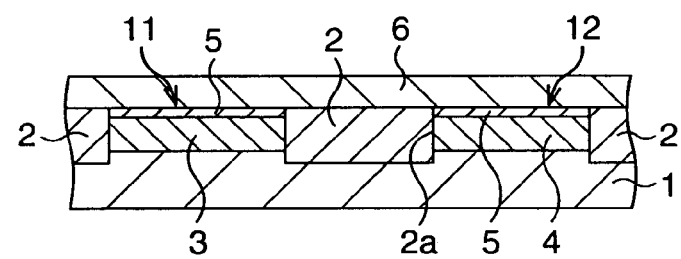

Subsequently, as shown in FIG. 2D, a resist 6 is applied on the entire surface including the surface of the first gate insulating film 5.

Specifically, the resist 6 is applied to have a film thickness of about 1.2 μm on the entire surface including the surface of the first gate insulating film 5 whose surface state is improved by the thinner application described above. At this time, due to superior wettability by the above-described thinner application, high adhesiveness of the first gate insulating film 5 and the resist 6 is secured.

Figure 2E:
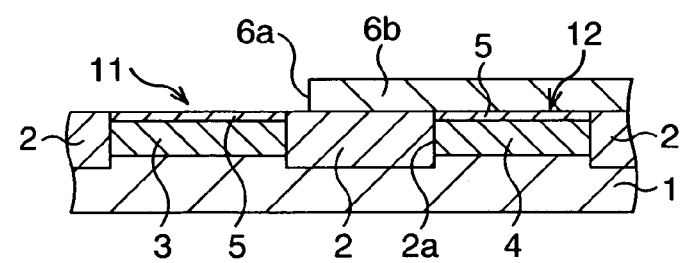

Subsequently, as shown in FIG. 2E, a resist pattern 6b is formed.

Specifically, the resist 6 is processed by lithography so that there is formed the resist pattern 6b having an opening 6a to expose a part of the surface of the first gate insulating film 5, the part corresponding to the position above only the active region 11.

Figure 2F:
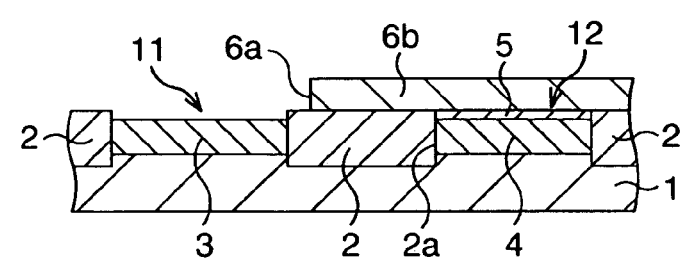

Subsequently, as shown in FIG. 2F, the first gate insulating film 5 is processed.

Specifically, with the resist pattern 6b being a mask, a part of the first gate insulating film 5 exposed from the opening 6a is removed by wet etching. At this time, the first gate insulting film 5 is processed in a shape in which only the part above the active region 11 is removed according to a shape of the opening 6a of the resist pattern 6b. For wet etching, an HF solution of 0.5% in concentration is used as an etching solution. In this case, even if a pinhole exists in the resist pattern 6b and the etching solution permeates through the pinhole, the etching solution hardly reaches the first gate insulating film 5 since high adhesiveness is secured between the first gate insulting film 5 and the resist pattern 6b, so that the first gate insulating film 5 is maintained in a state of good film quality as at a time of formation.

Figure 3A:
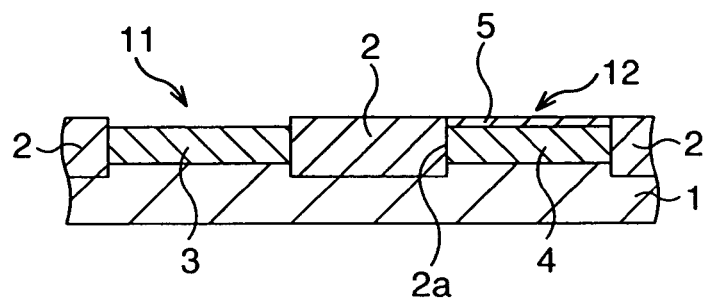
FIGS. 3A to 3D are schematic cross-sectional views, continued from FIG. 2, showing the manufacturing method of the MOS transistors according to the first embodiment step by step.

Subsequently, as shown in FIG. 3A, the resist pattern 6b is removed.

Specifically, the resist pattern 6b is dissolved and removed using a resist stripping solution. As the resist stripping solution, SPM and APM are used.

Figure 3B:
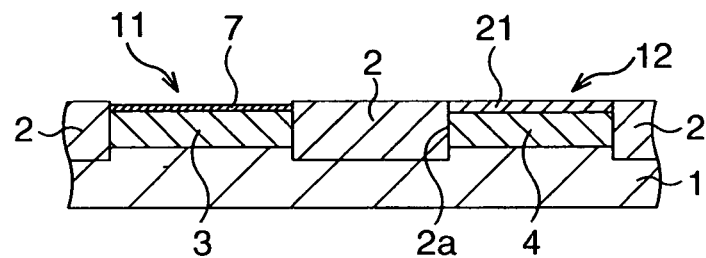

Subsequently, as shown in FIG. 3B, a second gate insulating film 7 is formed.

Specifically, an insulating film, here the second gate insulating film 7 made of a silicon oxide film is stacked and formed above the active regions 11, 12. As for a film formation condition of the silicon oxide film, the surface layers of the active regions 11, 12 are thermally oxidized in a wet atmosphere of 750° C. for example, to be formed into a film thickness of about 2 nm. At this time, above the active region 11 only the second gate insulating film 7, and above the active region 12 a two-layer film 21 of the first gate insulating film 5 and the second gate insulating film 7, are formed, respectively.

Figure 3C:
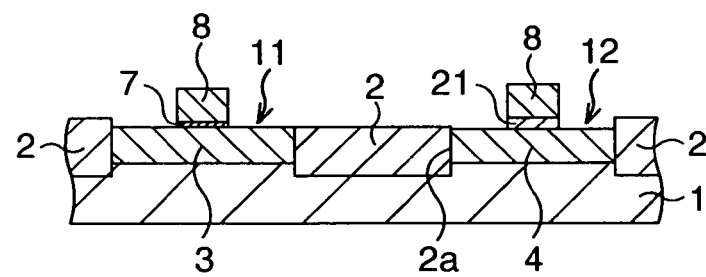

Subsequently, as shown in FIG. 3C, a gate electrode 8 is pattern-formed above the respective active regions 11, 12.

Specifically, first, a polycrystalline silicon film (not shown) for example, is formed on the entire surface. The polycrystalline silicon film is deposited to be about 200 nm in film thickness by a CVD method for example.

Next, the polycrystalline silicon film and the first gate insulating film 5 in the active region 11, and the polycrystalline silicon film and the two-layer film 21 above the active region 12 are processed by lithography and subsequent dry etching to be left in electrode shapes above the active regions 11, 12, respectively. At this time, above the active region 11 the gate electrode 8 via the second gate insulating film 7, and above the active region 12 the gate electrode 8 via the two-layer film 21, are pattern-formed, respectively. At this time, along with the etching of the gate insulting film 7 and the two-layer film 21, the surface layer of the element isolation layer 2 is also etched.

Figure 3D:
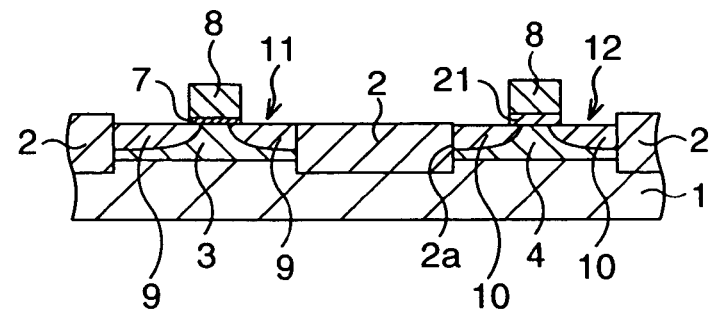

Subsequently, as shown in FIG. 3D, sources/drains 9, 10 are formed.

Specifically, with the respective electrodes 8 formed in the active regions 11, 12 being masks, impurities, here arsenic (As), are introduced into the active regions 11, 12, so that the sources/drains 9, 10 are formed in the surface layers of the active regions 11, 12 in both sides of the respective gate electrodes 8. Here, the introduction of the impurities is by ion implantation on conditions of a dose amount of about $3.0 \times 10^{15}/cm^2$ and acceleration energy of about 40 keV.

Thereafter, though depiction is omitted, after an interlayer insulating film is formed on the entire surface in such a manner to cover the respective gate electrodes 8, contact holes to expose parts of surfaces of the gate electrodes 8 and sources/drains 9, 10 are formed in the interlayer insulating film, and various wirings made by filling the contact holes with conductive materials are formed, so that a MOS transistor is accomplished.

As described above, according to the present embodiment, damage which the thin first gate insulating film 5 receives and which is mainly due to etching is restrained, so that the superior film quality and yield of the first and second gate insulating films 5, 7 are realized, and there can be obtained highly reliable MOS transistors capable of sufficiently coping with the further thinner film of the gate insulating film.

Second Embodiment

In this embodiment, there is disclosed a manufacturing method of MOS transistors for three power supplies, the MOS transistors having three types of gate insulating films of different film thicknesses. The same components and the like as in the first embodiment are indicated by the same reference symbols and numerals and the detailed descriptions may be omitted.

FIG. 6 to FIG. 8 are schematic cross-sectional views showing a manufacturing method of MOS transistors according to a second embodiment step by step.

First, as shown in FIG. 6A, element isolation structures 2 and wells 41, 42, 43 are formed on a semiconductor substrate 1.

First, as in FIG. 2A of the first embodiment, the element isolation structures 2 are formed by an STI method to define active regions 51, 52, 53. Here, the active region 51 is a forming region for a MOS transistor of low voltage drive, the active region 52 is a forming region for a MOS transistor of medium voltage drive higher than the MOS transistor of low voltage drive, and the active region 53 is a forming region for a MOS transistor of higher voltage drive than the MOS transistor of medium voltage drive.

Next, impurities, here boron (B), are introduced into the active regions 51, 52, 53 to form the wells 41, 42, 43 in surface layers of the active regions 51, 52, 53. Here, the introduction of the impurities is by ion implantation on conditions of a dose amount of about $5.0 \times 10^{13}/cm^2$ and acceleration energy of about 300 keV.

Subsequently, as shown in FIG. 6B, a first gate insulating film 5 is formed.

Specifically, an insulating film, here the first gate insulating film 5 made of a silicon oxide film, is formed above the active regions 51 to 53. As for a film formation condition of the silicon oxide film, the surface layers of the active regions 51 to 53 are thermally oxidized in a wet atmosphere of 750° C. for example, to be formed into a film thickness of about 6 nm.

Subsequently, as shown in FIG. 6C, a thinner is applied on the entire surface including a surface of the first gate insulating film 5.

At this time, as in the first embodiment, using any one of methods of FIG. 4A to FIG. 4D, the thinner is applied on the entire surface including the surface of the first gate insulating film 5 to wash the surface of the first gate insulating film 5. By this washing, a surface state of the first gate insulating film 5 is improved, so that wettability of the first gate insulating film 5 and a resist 44 described later is enhanced to obtain high adhesiveness of the both.

Subsequently, as shown in FIG. 6D, the resist 44 is applied on the entire surface including the surface of the first gate insulating film 5.

Specifically, the resist 44 is applied to have a film thickness of about 1.2 μm on the entire surface including the surface of the first gate insulating film 5 whose surface state is improved by the thinner application described above. At this time, due to the superior wettability by the above-described thinner application, high adhesiveness of the first gate insulating film 5 and the resist 44 is secured.

Subsequently, as shown in FIG. 6E, a resist pattern 44b is formed.

Specifically, the resist 44 is processed by lithography so that there is formed the resist pattern 44b having an opening 44a to expose a part of the surface of the first gate insulating film 5, the part corresponding to the position above only the active region 52.

Subsequently, as shown in FIG. 6F, the first gate insulating film 5 is processed.

Specifically, with the resist pattern 44b being a mask, a part of the first gate insulating film 5 exposed from the opening 44a is removed by wet etching. At this time, the first gate insulting film 5 is processed in a shape in which only the part above the active region 52 is removed according to a shape of the opening 44a of the resist pattern 44b. For wet etching, an HF solution of 0.5% in concentration is used as an etching solution. In this case, even if a pinhole exists in the resist pattern 44b and the etching solution permeates through the pinhole, the etching solution hardly reaches the first gate insulating film 5 since high adhesiveness is secured between the first gate insulting film 5 and the resist pattern 44b, so that the first gate insulating film 5 is maintained in a state of good film quality as at a time of formation.

Figure 7A:
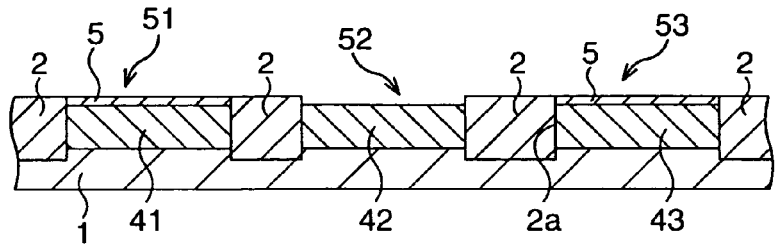
FIG. 7A to 7E are schematic cross-sectional views, continued from FIG. 6, showing the manufacturing method of the MOS transistors according to the second embodiment step by step.

Subsequently, as shown in FIG. 7A, the resist pattern 44b is removed.

Specifically, the resist pattern 44b is dissolved and removed using a resist stripping solution. As the resist stripping solution, SPM and APM are used.

Figure 7B:
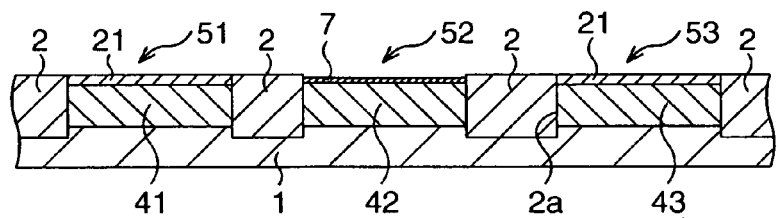

Subsequently, as shown in FIG. 7B, a second gate insulating film 7 is formed.

Specifically, an insulating film, here the second gate insulating film 7 made of a silicon oxide film is stacked and formed above the active regions 51 to 53. As for a film formation condition of the silicon oxide film, the surface layers of the active regions 51 to 53 are thermally oxidized in a wet atmosphere of 750° C. for example, to be formed into a film thickness of about 5 nm. At this time, above the active region 52 only the second gate insulating film 7, and above the active regions 51, 53 the first gate insulating film 5 and two-layer film 21 of the first gate insulating film 5 and the second gate insulating film 7, are formed, respectively.

Figure 7C:
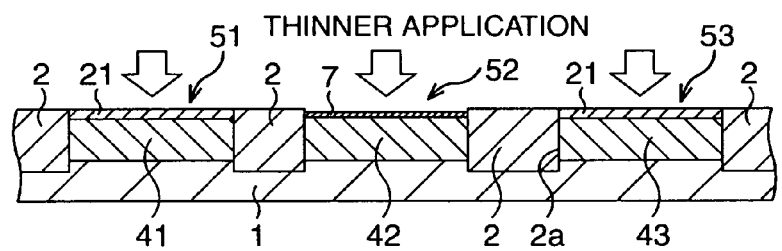

Subsequently, as shown in FIG. 7C, a thinner is applied on the entire surface including the surface of the second gate insulating film 7.

Here, as in the surface washing of the first gate insulating film 5, using any one of methods of FIG. 4A to FIG. 4D, the thinner is applied on the entire surface including the surface of the second gate insulating film 7 to wash the surface of the second gate insulating film 7. By this washing, a surface state of the second gate insulating film 7 is improved, so that wettability of the second gate insulating film 7 and a resist 45 described later is enhanced to obtain high adhesiveness of the both.

Figure 7D:
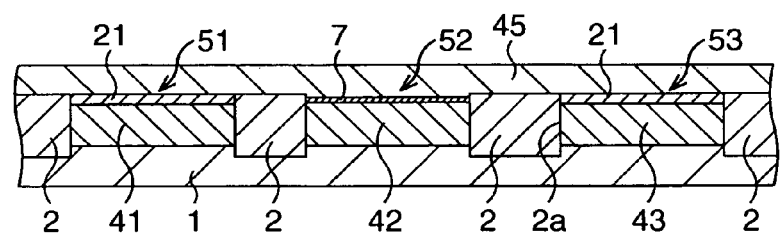

Subsequently, as shown in FIG. 7D, a resist 45 is applied on the entire surface including the surface of the second gate insulating film 7.

Specifically, the resist 45 is applied to have a film thickness of about 1.2 μm on the entire surface including the surface of the second gate insulating film 7 whose surface state is improved by the thinner application described above. At this time, due to the superior wettability by the above-described thinner application, high adhesiveness of the second gate insulating film 7 and the resist 45 is secured.

Figure 7E:
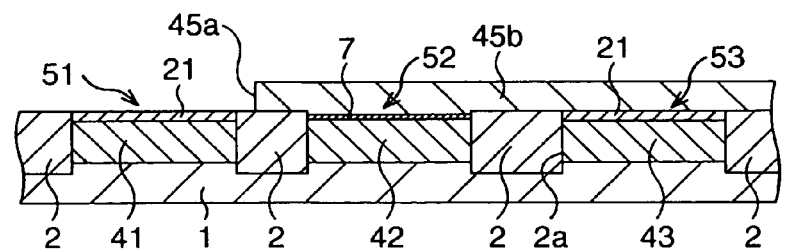

Subsequently, as shown in FIG. 7E, a resist pattern 45b is formed.

Specifically, the resist 45 is processed by lithography so that there is formed the resist pattern 45b having an opening 45a to expose a part of the surface of the second gate insulating film 7, the part corresponding to the position above only the active region 51.

Figure 8A:
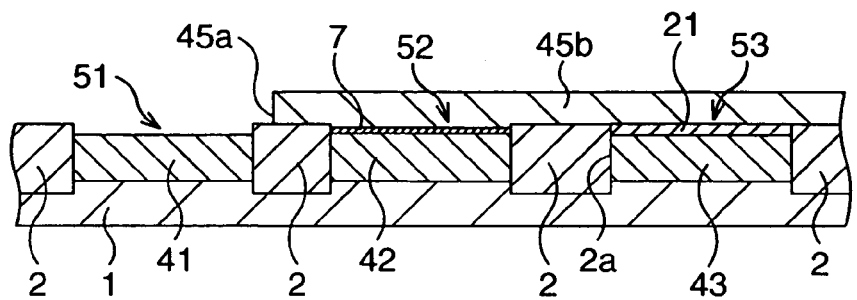
FIGS. 8A to 8E are schematic cross-sectional views, continued from FIG. 7, showing the manufacturing method of the MOS transistors according to the second embodiment step by step.

Subsequently, as shown in FIG. 8A, the two-layer film 21 is processed.

Specifically, with the resist pattern 45b being a mask, a part of the two-layer film 21 exposed from the opening 45a is removed by wet etching. At this time, the two-layer film 21 above the active region 51 is removed according to a shape of the opening 45a of the resist pattern 45b. For wet etching, an HF solution of 0.5% in concentration is used as an etching solution. In this case, even if a pinhole exists in the resist pattern 45b and the etching solution permeates through the pinhole, the etching solution hardly reaches the second gate insulating film 7 and the two-layer film 21 since high adhesiveness is secured between the second gate insulting film 7 and the two-layer film 21, and the resist pattern 45b. In particular, since the etching solution is prevented from reaching the second gate insulating film 7 which is formed in a state of single layer above the active region 52, the second gate insulating film 7 is maintained in a state of good film quality as at a time of formation.

Figure 8B:
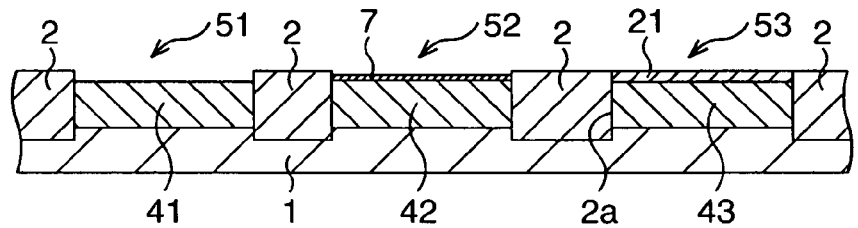

Subsequently, as shown in FIG. 8B, the resist pattern 45b is removed.

Specifically, the resist pattern 45b is dissolved and removed using a resist stripping solution. As the resist stripping solution, SPM and APM are used.

Figure 8C:
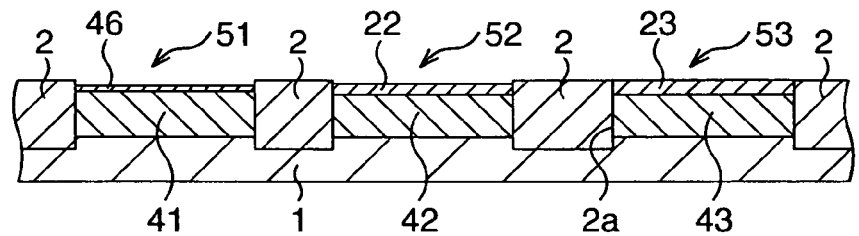

Subsequently, as shown in FIG. 8C, a third gate insulating film 46 is formed.

Specifically, an insulating film, here the third gate insulating film 46 made of a silicon oxide film is stacked and formed above the active regions 51 to 53. As for a film formation condition of the silicon oxide film, the surface layers of the active regions 51 to 53 are thermally oxidized in a wet atmosphere of 750° C. for example, to be formed into a film thickness of about 2 nm. At this time, above the active region 51 only the third gate insulating film 46, above the active region 52 a two-layer film 22 of the second gate insulating film 7 and the third gate insulating film 46, and above the active region 53 a three-layer film 23 of the first gate insulating film 5, the second gate insulating film 7 and the third gate insulating film 46, are formed, respectively.

Figure 8D:
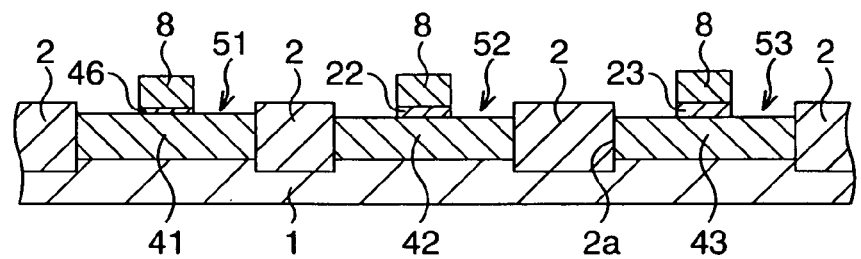

Subsequently, as shown in FIG. 8D, gate electrodes 8 are pattern-formed above the respective active regions 51 to 53.

Specifically, first, a polycrystalline silicon film (not shown) for example, is formed on an entire surface. The polycrystalline silicon film is deposited to be about 200 nm in film thickness by a CVD method for example.

Next, the polycrystalline silicon film and the first to third gate insulating films 5, 7, 46 are processed by lithography and subsequent dry etching to be left in electrode shapes above the active regions 51 to 53, respectively. At this time, above the active region 51 the gate electrode 8 via the third gate insulating film 46, above the active region 52 the gate electrode 8 via the two-layer film 22, and above the active region 53 the gate electrode 8 via the three-layer film 23, are pattern-formed, respectively. At this time, along with the etching of the gate insulting film 7, the two-layer film 22 and the three-layer film 23, the surface layers of the element isolation layers 2 are also etched.

Figure 8E:
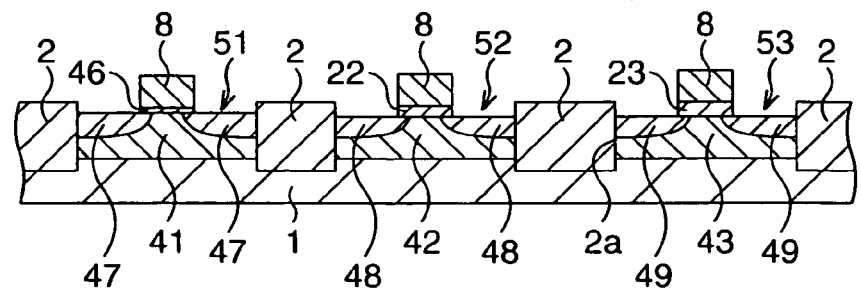

Subsequently, as shown in FIG. 8E, sources/drains 47, 48, 49 are formed.

Specifically, with the respective gate electrodes 8 formed in the active regions 51, 52, 53 being masks, impurities, here arsenic (As), are introduced into the active regions 51, 52, 53, so that the sources/drains 47, 48, 49 are formed in the surface layers of the active regions 51, 52, 53 in both sides of the respective gate electrodes 8. Here, the introduction of the impurities is by ion implantation on conditions of a dose amount of about $3.0 \times 10^{15}/cm^2$ and acceleration energy of about 40 keV.

Thereafter, though depiction is omitted, after an interlayer insulating film is formed on the entire surface in such a manner to cover the respective gate electrodes 8, contact holes to expose parts of surfaces of the gate electrodes 8 and sources/drains 47 to 49 are formed in the interlayer insulating film, and various wirings made by filling the contact holes with conductive materials are formed, so that MOS transistors are accomplished.

As described above, according to the present embodiment, there can be obtained highly reliable MOS transistors capable of sufficiently coping with the further thinner gate insulating film by restraining damage which the thin first and second gate insulating films 5, 7 receive mainly due to etching and realizing superior film quality and yield of the first and second gate insulating films 5, 7.

Incidentally, in the first embodiment two types of MOS transistors with different film thicknesses, and in the second embodiment three types of MOS transistors with different film thicknesses, are exemplified, but the present invention is not limited thereby and four or more types of MOS transistors with different film thicknesses can be manufactured by repeating the same steps.

According to the present invention, there can be obtained a highly reliable semiconductor device capable of sufficiently coping with the further thinner gate insulating film by restraining damage which the thin gate insulating film receives mainly due to etching and realizing superior film quality and yield of the gate insulating film.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A manufacturing method of a semiconductor device comprising at least two types of transistors in which film thicknesses of gate insulating films are different, the manufacturing method comprising:
    forming a first gate insulating film above a semiconductor substrate;
    applying a thinner on a surface of the first gate insulating film;

forming a resist pattern above the first gate insulating film on which the thinner has been applied;

etching the first gate insulating film with the resist pattern being a mask, to remove a part of the first gate insulating film; and forming a second gate insulating film to form a region in which only the second gate insulating film is formed and a region in which at least the first and second gate insulating films are stacked, wherein a dose of the thinner applied per unit area is $6 \times 10^{-5}$ cc/cm$^2$ or greater.

2. The manufacturing method of the semiconductor device according to claim 1, wherein the first and second gate insulating films are formed respectively by a thermal oxidation method.

3. The manufacturing method of the semiconductor device according to claim 1, wherein the etching is wet etching.

4. The manufacturing method of the semiconductor device according to claim 1, wherein, while the semiconductor substrate is being rotated in relation to a nozzle, the thinner is supplied from the nozzle.

5. The manufacturing method of the semiconductor device according to claim 4, wherein the thinner is supplied with the nozzle being moved in a radial direction between a central portion of the rotation and a peripheral edge of the rotation.

6. The manufacturing method of the semiconductor device according to claim 4, wherein a plurality of supply holes of the nozzle are disposed in the radial direction of the rotation so that the thinner is supplied simultaneously or sequentially from the respective supply holes.

7. The manufacturing method of the semiconductor device according to claim 4, wherein a supply hole of the nozzle is provided linearly in the radial direction of the rotation so that the thinner is supplied from the supply hole.

8. The manufacturing method of the semiconductor device according to claim 1, wherein the dose of the thinner applied per unit area is no more than $1.3 \times 10^{-4}$ cc/cm$^2$.

9. A manufacturing method of a semiconductor device comprising at least two types of transistors in which film thicknesses of gate insulating films are different, the manufacturing method comprising:

forming a first gate insulating film above a semiconductor substrate;

applying a thinner on a surface of the first gate insulating film;

forming a resist pattern above the first gate insulating film on which the thinner has been applied;

etching the first gate insulating film with the resist pattern being a mask, to remove a part of the first gate insulating film; and forming a second gate insulating film to form a region in which only the second gate insulating film is formed and a region in which at least the first and second gate insulating films are stacked, wherein the first and second gate insulating films are formed respectively by a thermal oxidation method, and a dose of the thinner applied per unit area is $6 \times 10^{-5}$ cc/cm$^2$ or greater.

10. The manufacturing method of the semiconductor device according to claim 9, wherein the dose of the thinner applied per unit area is no more than $1.3 \times 10^{-4}$ cc/cm$^2$.

* * * * *

UNITED STATES PATENT AND TRADEMARK OFFICE
CERTIFICATE OF CORRECTION

| | |
|---|---|
| PATENT NO. | : 7,615,431 B2 |
| APPLICATION NO. | : 11/214888 |
| DATED | : November 10, 2009 |
| INVENTOR(S) | : Tomokazu Kawamoto |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 827 days.

Signed and Sealed this
Third Day of May, 2011

David J. Kappos
*Director of the United States Patent and Trademark Office*